United States Patent [19]
Pfiester et al.

[11] Patent Number: 4,743,563
[45] Date of Patent: May 10, 1988

[54] PROCESS OF CONTROLLING SURFACE DOPING

[75] Inventors: James R. Pfiester; John R. Alvis, both of Austin, Tex.; Orin W. Holland, Oak Ridge, Tenn.

[73] Assignee: Motorola, Inc., Schaumburg, Ill.

[21] Appl. No.: 53,917

[22] Filed: May 26, 1987

[51] Int. Cl.[4] .................. H01L 21/265; H01L 21/22; H01L 17/00
[52] U.S. Cl. .......................... 437/024; 148/DIG. 82; 437/20; 437/27; 437/34; 437/69; 437/70
[58] Field of Search .................. 437/24, 20, 27, 34, 437/69, 70

[56] References Cited

U.S. PATENT DOCUMENTS

| 3,933,530 | 1/1976 | Mueller et al. | 437/24 |
| 4,013,484 | 3/1977 | Boleky et al. | 437/34 |
| 4,027,380 | 6/1977 | Deal et al. | 437/34 |
| 4,133,704 | 1/1979 | MacIver et al. | 437/20 |
| 4,144,100 | 3/1979 | MacIver et al. | 437/27 |
| 4,466,171 | 8/1984 | Jochems | 437/34 |
| 4,516,316 | 5/1985 | Haskell | 437/34 |

OTHER PUBLICATIONS

"Effect of Fluorine Implantation on the Kinetics of Dry Oxidation of Silicon", J. Appl. Phys. 60 (3), Aug. 1, 1986, pp. 985-990.
"Donor Generation in Monocrystalline Silicon by Halogen Implantation", Solid State Electronics, vol. 26, No. 3, pp. 241-246, 1983.
"Dopant Dependence of the Oxidation Rate of Ion Implanted Silicon Radiation Effects, vol. 47, pp. 203-210, 1980.
"Kinetics of the Thermal Oxidation of Silicon in $O_2$/HCl Mixtures", J. Electrochem Soc. vol. 124, No. 5, May 1977, pp. 735-739.
"Selective Oxidation Technologies for High Density MOS", IEEE Electron Device Letters, EDL-2, No. 10, Oct. 1981, pp. 244-247.
"Electrical Properties of MOS Devices Made with SILO Technology", IEDM 82, pp. 220-222.

Primary Examiner—Upendra Roy
Attorney, Agent, or Firm—John A. Fisher; Jeffrey Van Myers

[57] ABSTRACT

A process is disclosed for controlling the surface doping of two regions of a semiconductor device and more specifically for using such control to achieve the necessary field doping in a CMOS device structure. In accordance with one embodiment of the invention a silicon substrate is provided which has first and second regions of opposite conductivity type. A uniform doping such as by ion implantation is provided into each of the conductivity regions. The two regions or portions thereof are then simultaneously differently oxidized to cause a differential segregation of the dopant into the thermally grown oxide. The differential oxide growth can be achieved by selectively implanting halogen ions into the wafer surface prior to the thermal oxidation.

10 Claims, 3 Drawing Sheets

PROCESS OF CONTROLLING SURFACE DOPING

RELATED APPLICATION

This application is related to commonly assigned patent application, Ser. No. 053,919 filed 5/26/87 concurrently herewith.

BACKGROUND OF THE INVENTION

This invention relates generally to an improved process for controlling surface doping and to improved methods for isolating between semiconductor devices, and more specifically to improved methods for isolating between CMOS devices.

In the formation of semiconductor devices, and specifically in the fabrication of semiconductor integrated circuits, an oxide layer, usually called a "field oxide", is used to isolate between adjacent devices. This is especially true with insulated gate field effect transistor circuits (MOS circuits), but is true of bipolar and other circuits as well.

Field oxide is usually formed by a process in which an oxidation resistant material such as silicon nitride or a combination of silicon nitride with silicon oxide or other materials is formed on a semiconductor substrate overlying active device regions where transistors or other devices are to be formed. The substrate is then heated in an oxidizing ambient to grow a thermal oxide on those portions of the substrate not protected by the oxidation resistant material. The nature of thermal oxide formation causes the oxide so formed to be recessed into the silicon substrate as silicon is incorporated into the silicon oxide.

In addition to the thick field oxide, a field doping region is also used to enhance the isolation. Field doping is an enhanced doping at the silicon surface, beneath and preferably in alignment with the field oxide, which increases the field threshold voltage and thus reduces the possibility of parasitic device action between adjacent unrelated devices. In a CMOS structure the field doping may include both enhanced N-type doping and P-type doping in the surface regions which are doped N-type and P-type, respectively.

There are a number of problems associated with the use of a conventional process for the formation of the localized silicon oxide isolation. These problems are especially significant with newer circuits which utilize an ever increasing number of devices and in which the devices are of ever decreasing size, both in surface area and depth. To produce a thermal oxide of sufficient thickness to provide the desired electrical isolation between devices requires a significant amount of processing at an elevated temperature. Long times at elevated temperatures are inconsistent with shallow devices and tend to cause crystalline defects in the semiconductor substrate. In addition, as thermal oxides grow in thickness, they also grow laterally. Thick oxides thus use a considerable amount of lateral space and accordingly require an increase in the size of the circuit chip. This is especially true when the circuit involves a large number of devices and thus a large number of isolation regions between the devices. Still further, as the thermal oxide grows and expands laterally, the oxide encroaches under the edge of the oxidation resistant material, causing a lifting of the edge of the oxidation resistant material and forming what is known in the semiconductor industry as a "bird's beak".

The incorporation of field doping in combination with the field oxide requires additional masking steps in the device fabrication process, and especially in the CMOS process where separate N and P-type field doping must be accommodated. That is, the field doping in at least two regions of the CMOS chip must be controlled to provide the required isolation between devices. Each additional mask step adds to the cost of the process and potentially decreases the yield. Accordingly, there is a need for an improved process which reduces the number of masking and other process steps required to produce a given device structure. There is also a need for an improved process which overcomes the foregoing and other problems associated with the conventional formation of isolating thermal oxide and which can also provide self-alignment of field doping and field oxides.

Accordingly, it is an object of this invention to provide an improved process for controlling the surface doping of a semiconductor device.

It is another object of this invention to provide an improved process for isolating between devices in a CMOS integrated circuit.

It is yet another object of this invention to provide an improved process for fabricating CMOS circuits with a reduced number of masking layers.

BRIEF SUMMARY OF INVENTION

The foregoing and other objects and advantages of the invention are achieved through an improved process in which doping is controlled by a differential oxidation process. In accordance with one embodiment of the invention, a silicon substrate is provided which has first and second oppositely doped surface regions. A uniform doping is provided into each of the first and second regions and each region is then simultaneously but differentially oxidized causing a differential segregation of the originally uniform doping.

DETAILED DESCRIPTION OF PREFERRED EMBODIMENTS

An important element of the present invention is the simultaneous growth, on two portions of a semiconductor substrate, of a thermal oxide with the two portions having different oxide growth rates. FIGS. 1-4 illustrate a preferred embodiment for achieving a locally enhanced oxide growth rate as one component of the necessary two region, differential growth rate requirement. Additionally, as illustrated, the preferred process for achieving the enhanced growth rate achieves this enhanced growth rate preferentially in the vertical direction compared to the lateral direction.

As illustrated in FIGS. 1-4, localized oxide regions, recessed into the surface of a semiconductor substrate, are formed by a process in which the vertical growth rate is enhanced. Incorporation of this process into a process in accordance with the invention will be illustrated in the illustrative embodiment shown in FIGS. 5-8. The process illustrated in FIGS. 1-4 illustrates the formation of oxide isolation regions without the accompanying field doping.

Figure 1:
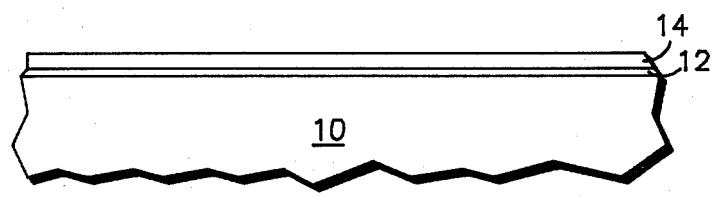
FIGS. 1-4 illustrate, in cross-section, process steps wherein an isolating oxide is formed between device regions.

FIG. 1 illustrates, in cross-section, a portion of a semiconductor substrate 10 in which it is desired to form a plurality of active regions which are isolated at the substrate surface by a localized oxide. Overlying the surface of substrate 10 is an oxidation resistant layer of material. In the illustrative embodiment the oxidation resistant layer includes a thin layer 12 of silicon dioxide and an overlying layer 14 of silicon nitride. Alternatively, the oxidation resistant material can be a layer of silicon nitride alone, various layers of oxide and nitride, silicon oxynitride, aluminum oxide, or the like.

Figure 2:
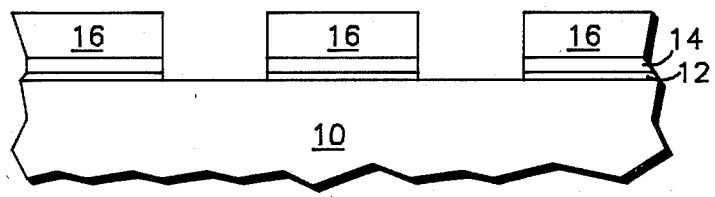

The process continues by patterning the oxidation resistant material to leave the material overlying the active device portions of the substrate. As illustrated in FIG. 2, the patterning of the oxidation resistant material is accomplished by applying and photolithographically patterning a layer of photoresist to form photoresist regions 16 overlying what will become the active regions of the device to be formed. FIG. 2 shows three such regions, although the number, location, and shape of these regions will depend upon the device being fabricated. Patterned photoresist 16 is used in conventional manner to pattern the underlying layers of silicon nitride and silicon oxide. The patterning of the oxidation resistant material is done in conventional manner and is not critical to the practice of the invention.

Figure 3:
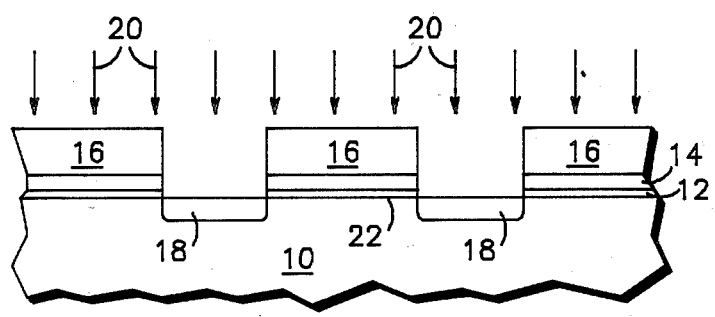

To achieve an enhanced oxide growth rate, halogen ions, and preferably chlorine ions, are implanted selectively into the surface of substrate 10 as illustrated in FIG. 3. The ions are selectively implanted into the substrate surface using the patterned oxidation resistant material 12,14 and preferably also the patterned photoresist 16 as an ion implantation mask. Implanted regions 18, which are doped with the halogen ions, are formed at the substrate surface in those locations where field oxide is to be formed. The implantation of ions, as illustrated by arrows 20, is an anisotropic process so that the location of the ions in the substrate is limited in lateral extent by the masking layers 12,14,16. In this and the following discussion the terms "lateral" and "vertical" are referenced to the major surface 22 of substrate 10 and represent directions parallel and perpendicular thereto, respectively. Because of the anisotropic nature of the ion implantation process, implanted regions 18 are aligned with the openings in the implant mask with only minor extension (due to scattering and the like) of ions laterally underneath the masking layer.

Figure 4:
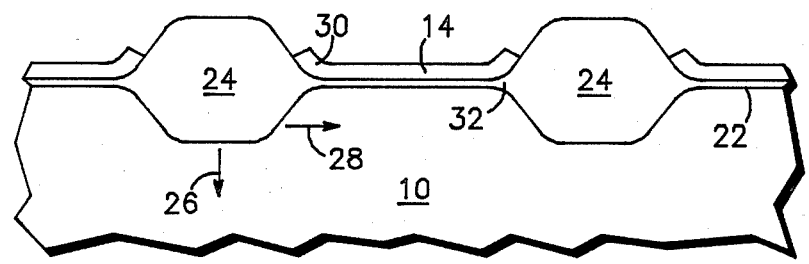

After removing photoresist layer 16, the exposed portions of substrate 10 are thermally oxidized to grow localized field oxide regions 24 as illustrated in FIG. 4. As is well known, the nature of the oxidation process causes field oxide 24 to be partially recessed below the original surface 22. The localized implantation of halogen ions into the surface of substrate 10 causes the oxidation rate in the presence of those halogen ions to markedly increase over the oxidation rate in the absence of such halogen ions. An important result of the process of implanting halogen ions and then oxidizing is the increase in the oxidation rate in the vertical direction compared to the lateral direction. Conventional oxidation is an isotropic process. By implanting halogen ions before the oxidating, the oxidation process becomes anisotropic with the vertical growth rate in the direction illustrated by arrow 26 exceeding the lateral growth rate in the direction indicated by arrow 28. The anisotropic nature of the oxidation process apparently results from the localized implantation of the halogen ions; the oxidation rate is increased only in those regions which are doped with the halogen ions. In addition to making the oxidation anisotropic, by selectively implanting, the enhanced oxidation is also made selective. Different growth rates in implanted and unimplanted areas are thus realized.

The oxidation of substrate 10 to form field oxide regions 24 causes the oxide to extend into the surface laterally as well as vertically. The lateral growth of oxide 24 causes the well known upward bending 30 of nitride layer 14 with the consequent formation of bird's beak 32. The lateral expansion of the field oxide and the formation of the bird's beak are deleterious because the lateral encroachment reduces the area of the active region, thus requiring an increase in the size of the integrated circuit chip. By increasing the vertical growth rate relative to the lateral growth rate, a field oxide of the desired and necessary thickness is achieved with a reduced width and thus reduced encroachment into the active area. The increased oxidation rate also reduces the oxidation time required to achieve the necessary thickness and thus reduces the amount of time the device structure is exposed to a high temperature.

FIGS. 5-8 illustrate, in cross-section, process steps in accordance with one embodiment of the invention, specifically for the fabrication and isolation of a CMOS device structure. In this embodiment the above-described oxide enhancement is combined with a dopant diffusion to provide an improved process for controlling the surface doping of at least two regions on a semiconductor surface, namely the field regions over the complementary N and P-type surface regions.

Figure 5:
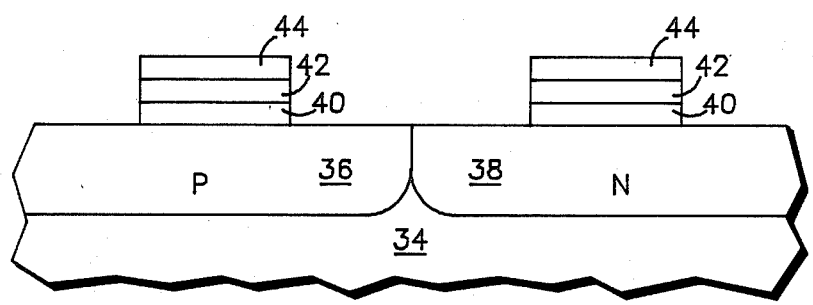
FIGS. 5-8 illustrate schematically, in crosssection, process steps in accordance with one embodiment of the invention wherein isolation is formed in a complementary substrate using a reduced number of masking steps.
Figure 6:
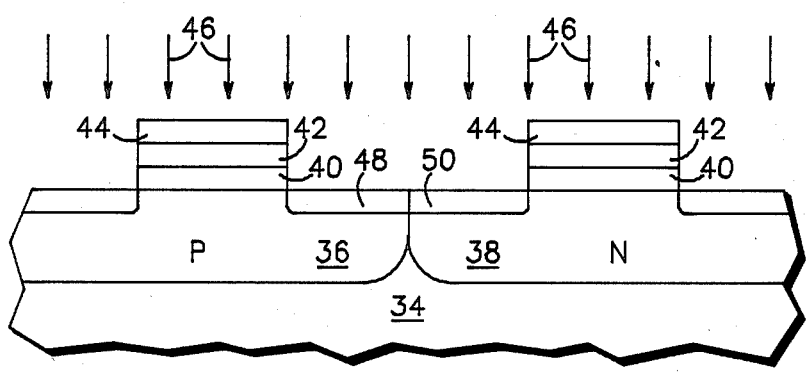
Figure 7:
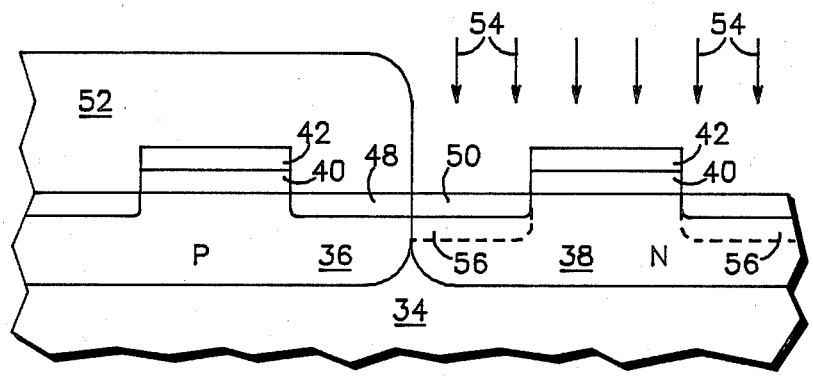

FIG. 5 illustrates, in cross-section, a portion of a substrate 34 for the fabrication of a CMOS integrated circuit. The early processing steps have already been completed to fom complementary regions 36 and 38. Region 36 is of P-type conductivity and region 38 is of N-type conductivity. Overlying each of the complementary regions is a patterned layer of oxidation resistant material which, for purposes of illustration, includes an oxide layer 40 and an overlying layer of silicon nitride 42. The oxidation resistant material is patterned using a patterned photoresist 44.

Using the photoresist, nitride, and oxide as an implantation mask, the surface of the substrate 34 is implanted with boron as illustrated by arrows 46. The boron implantation forms a shallow boron doped region 48,50 at the surface of the P-type and N-type regions 36,38 respectively. The boron will eventually provide an enhanced field threshold voltage for the portion of the substrate beneath the field oxide to be formed in the Ptype region 36. The boron is uniformly implanted into both N-type and P-type regions, however, so that this implantation can be done without an additional implantation mask.

Photoresist layer 44 is removed after the boron implantation and an additional photoresist mask 52 is applied and patterned to mask P-type region 36. The unmasked portions of substrate 34 are implanted with halogen as illustrated by arrows 54 in FIG. 7 to form halogen doped regions 56 at the surface of N-type region 38. The energy of the halogen implant is selected so that the implant is masked by nitride 42 and oxide 40 as well as by photoresist mask 52. The halogen ions are thus implanted into what will become the field regions of the N-type region 38.

Figure 8:
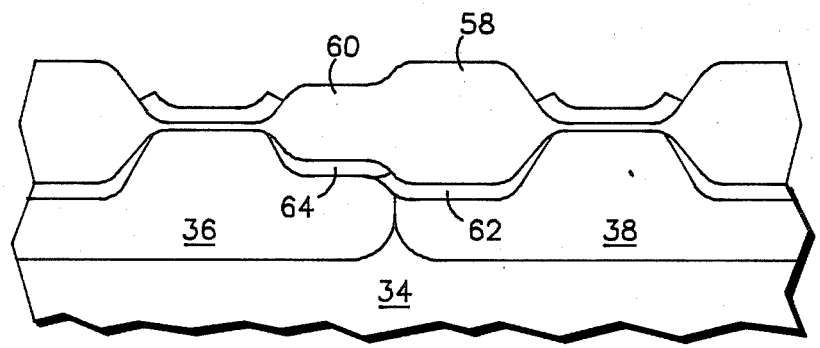

After removing photoresist mask 52, the exposed portions of substrate 34 are thermally oxidizd to form field oxide regions 58,60 as illustrated in FIG. 8. Underlying field oxide 58 is an N-type region 2, and underlying field oxide region 60 is a P-type doped region 64. Because of the halogen implant and the enhanced oxidation rate which accompanies such an implant, field oxide region 58 is of greater thickness over N-type region 38 than is field oxide 60 formed over P-type region 36.

During the growth of the thermal oxide, dopants originally located in the semiconductor substrate, such as boron and phosphorus, tend to segregate into the growing oxide or into the silicon substrate depending upon the segregation coeffients characteristic of those dopant materials. Boron, for example, has a greater tendency to segregate into the growing thermal oxide and phosphorus has a tendency to segregate into or remain in the silicon substrate. Thus during the formation of the thermal field oxide, and especially during the differential growth of those oxides caused by the localized implantation of the halogen ions, the implanted boron from doped layer 50 is incorporated within field oxide 58. At the same time, phosphorus which was in the silicon consumed by the oxidation process is left behind in the silicon near the newly formed silicon-oxide interface. The phosphorus thus "piles up" at the silicon surface. The incorporation of boron into oxide 58, combined with the pile up of phosphorus in the silicon at the interface with the oxide, causes the region immediately under oxide 58 to be strongly N-type. In contrast, the lesser amount of oxidation which takes place with the formation of field oxide 60 is insufficient to incorporate all of the implanted boron which was in region 48 so that immediately beneath oxide 60 is a heavily doped P-type region 64. In this context the term "heavily doped" means more heavily doped than the adjacent background material. The differential oxidation range caused by the localized implantation of halogen ions thus results in an enhanced guard ring doping beneath the field oxides in both the N-type and P-type surface regions without the necessity for separate masking and implantation of P and N-type guard ring dopants.

In accordance with specific embodiments of the invention, silicon substrates were implanted with halogen ions, specifically including chlorine ions and fluorine ions. Enhancement in the oxidation rate was found to be greatest with implantations of chlorine ions. The silicon samples were implanted with chlorine ions at implant energies between 20 kev and 160 kev. Doses ranged from $2.5 \times 10^{15}$ cm$^{-2}$ to $1.0 \times 10^{16}$ cm$^{-2}$. In addition, some samples were implanted with multiple implants at a variety of energies to provide chlorine ions distributed with depth in the silicon wafer. The graded or multiple implants includes, for example, implants of: $1.0 \times 10^{16}$ cm$^{-2}$ at 160 kev, $4.7 \times 10^{15}$ cm$^{-2}$ at 65 kev, and $1.8 \times 10^{15}$ cm$^{-2}$ at 20 kev or $5.0 \times 10^{15}$ cm$^{-2}$ at 160 kev, $2.3 \times 10^{15}$ cm$^{-2}$ at 65 kev, and $0.9 \times 10^{-15}$ cm$^{-2}$ at 20 kev.

Samples were subsequently oxidized at temperatures from about 830° C. to about 1000° C. The lower limit represents a temperature below which the oxidation rate was too low to be practical in a manufacturing environment. The upper limit is the highest temperature to which it was desired to subject the particular devices being fabricated. Oxidation in accordance with the invention can, of course, be carried out at temperatures either above or below the indicated range provided the temperature can be accommodated within the particular manufacturing process. Using the above indicated range of processing parameters, oxidation enhancements of as much as 95% were observed. The greatest enhancement in oxidation rate was found for the graded multiple implant with the oxidation being carried out for a short period of time at 1000° C.

In accordance with a specific illustrative, nonlimiting example, devices were fabricated using the following processing conditions. CMOS devices of the twin-well type were fabricated by oxidizing a silicon wafer to grow 30 nanometers of oxide on the surface. The wafers were selectively implanted through the oxide, with phosphorus at 100 kev to a dose of $5 \times 10^{12}$ cm$^{-2}$ and with boron at 40 kev to a dose of $5 \times 10^{12}$ cm$^{-2}$ to dope the N and P-type wells, respectively. The well implants were redistributed by annealing for four hours at 1200° C. to achieve a surface concentration of approximately $2 \times 10^{16}$ cm$^{-3}$. The active area of the devices was masked with an oxidation resistant barrier including a layer of thermal oxide overlaid with a layer of deposited silicon nitride. The oxide and nitride, together with a layer of photoresist used to pattern them, was used as an implant mask to mask a boron implant which was implanted uniformly over the exposed portions of both the N and P-type wells. For the boron implant the wafers were divided into two groups, with one group receiving a boron implant of $1.0 \times 10^{13}$ cm$^{-2}$ at 50 kev and with the other group receiving a boron implant of $2.0 \times 10^{13}$ cm$^{-2}$ at 35 kev. The P-type well was then masked with photoresist and the N-type well received a chlorine implant consisting of two separate implants as follows: $5.0 \times 10^{15}$ cm$^{-2}$ at 150 kev and $2.5 \times 10^{15}$ cm$^{-2}$ at 65 kev. The wafers were then oxidized for 190 minutes at 1000° C. to form a thermal oxide of about 750 nanometers thickness on the unimplanted portion. The oxide on the chlorine implanted portion grew to a thickness of approximately 915 nanometers, representing an oxide enhancement of 22%. The fabrication of CMOS structures was then completed in normal fashion by steps including the growth of a gate oxide, deposition of polycrystalline silicon, deposition and patterning of contact metal, and the like. The structures were measured to determine the field threshold voltage in both the N and P-well regions. In the N-well region the field threshold was about −35 volts for both boron doping cycles. In contrast, control devices which did not receive a chlorine implant had field thresholds of only −14.4 and −16.4 volts for the heavy and light boron implants, respectively. The field threshold voltage in the P-well region was measured to be 10.1 and 13.9 volts for the light and heavy boron implants respectively.

Thus it is apparent that there has been provided, in accordance with the invention, an improved process for controlling the surface doping of two regions in a semiconductor device, and more specifically for forming isolation between CMOS devices, which fully meets the objects and advantages set forth above. Although the invention has been described and illustrated by reference to specific embodiments thereof, it is not intended that the invention be limited to those illustrative embodiments. Those skilled in the art will recognize that modifications and variations can be made without departing from the spirit of the invention. For example, other oxidation resistant layers, other oxidation conditions and ambients, other implant doses and implant energies, and the like can be used in fabricating semiconductor devices. Accordingly, it is intended to encompass within the invention all such modifications and variations as fall within the scope of the appended claims.

We claim:

1. A process for isolating between devices in a CMOS integrated circuit which comprises the steps of:
   providing a silicon substrate having a surface, said surface having a region of N-type conductivity and a region of P-type conductivity;
   forming a layer of oxidation resistant material overlying active areas of each of said regions;
   implanting boron into portions of said surface not overlaid by said oxidation resistant material including said region of N-type conductivity and said region of P-type conductivity;
   selectively implanting halogen ions into a portion of said region of N-type conductivity, said portion of said region being a subset, less than the whole, of said portions implanted with boron;
   and thermally oxidizing said substrate to form an oxide between said active areas.

2. The process of claim 1 wherein said step of selectively implanting halogen ions comprises implanting chlorine ions.

3. The process of claim 2 wherein said step of implanting chlorine ions comprises implanting ions at a plurality of different implant energies.

4. A process for controlling the surface doping of two regions of a semiconductor device comprising the steps of:
   providing a silicon substrate having a surface with first and second regions;
   providing a uniform doping into each of said first and second regions;
   selectively implanting halogen ions into only one of said first and second regions;
   and heating said substrate in an oxidizing ambient to simultaneously differentially oxidize said surface of each of said first and second regions.

5. The process of claim 4 wherein said step of providing said silicon substrate comprises providing a silicon substrate having a first region of N-type conductivity and a second region of P-type conductivity.

6. The process of claim 4 wherein said step of implanting halogen ions comprises implanting chlorine ions.

7. The process of claim 5 wherein said step of providing a uniform doping comprises forming a boron doped layer at said surface of said first and second regions.

8. The process of claim 5 wherein said step of providing a uniform doping comprises implanting boron ions into said surface of said first and second regions.

9. The process of claim 5 wherein said step of providing a uniform doping comprises unmasked implanting of boron ions into said surface of said first and second regions.

10. The process of claim 9 wherein said step of simultaneously differentially oxidizing comprises the steps of:
    selectively implanting halogen ions into one of said first and second regions;
    and heating said substrate in an oxidizing ambient.

* * * * *